United States Patent
Bhatnagar

[11] Patent Number: 6,029,602
[45] Date of Patent: Feb. 29, 2000

[54] APPARATUS AND METHOD FOR EFFICIENT AND COMPACT REMOTE MICROWAVE PLASMA GENERATION

[75] Inventor: Yashraj K. Bhatnagar, Santa Clara, Calif.

[73] Assignee: Applied Materials, Inc., Santa Clara, Calif.

[21] Appl. No.: 08/839,007

[22] Filed: Apr. 22, 1997

[51] Int. Cl.⁷ .................................................. C23C 16/00
[52] U.S. Cl. ........................... 118/723 ME; 118/723 MR; 156/345; 315/111.21
[58] Field of Search ................... 118/723 ME, 723 MW, 118/723 MR; 156/345; 204/298.38; 315/111.21; 333/208, 212

[56] References Cited

U.S. PATENT DOCUMENTS

| | | | |
|---|---|---|---|
| 4,736,304 | 4/1988 | Doehler | 364/469 |
| 4,831,963 | 5/1989 | Saito et al. | 118/723 |
| 4,946,549 | 8/1990 | Bachman et al. | 156/643 |
| 5,002,632 | 3/1991 | Loewenstein et al. | 156/643 |
| 5,082,517 | 1/1992 | Moslehi | 156/345 |
| 5,111,111 | 5/1992 | Stevens et al. | 315/111.41 |
| 5,133,825 | 7/1992 | Hakamata et al. | 156/345 |
| 5,234,526 | 8/1993 | Chen et al. | 156/345 |
| 5,234,529 | 8/1993 | Johson | 156/345 |
| 5,266,364 | 11/1993 | Tamura et al. | 427/571 |
| 5,306,985 | 4/1994 | Berry | 315/111.41 |
| 5,364,519 | 11/1994 | Fujimura et al. | 204/298.38 |
| 5,387,288 | 2/1995 | Shatas | 118/723 AN |
| 5,449,434 | 9/1995 | Hooke et al. | 216/70 |
| 5,466,991 | 11/1995 | Berry | 315/11.41 |
| 5,567,241 | 10/1996 | Tsu et al. | 118/723 MW |
| 5,645,644 | 7/1997 | Mabuchi et al. | 118/723 MW |
| 5,785,807 | 7/1998 | Kanai et al. | 156/662.1 |

FOREIGN PATENT DOCUMENTS

| | | | |
|---|---|---|---|
| 9363609 | 3/1993 | France | H05H 1/46 |
| 63-278396 | 1/1988 | Japan | C23C 16/44 |
| 2-295407 | 2/1990 | Japan | H01L 1/302 |
| 5-135901 | 7/1993 | Japan | H05H 1/46 |
| WO 94/21096 | 9/1994 | WIPO | H05H 1/46 |

Primary Examiner—Robert Kunemund
Assistant Examiner—Luz Alejandro
Attorney, Agent, or Firm—Townsend & Townsend & Crew

[57] ABSTRACT

An apparatus and methods for a CVD system incorporates a plasma system for efficiently generating a plasma remotely from a substrate processing zone. The remotely generated plasma may be used to clean unwanted deposits from a chamber, or may be used during substrate processing for etching or depositing processes. In a specific embodiment, the present invention provides an easily removable, conveniently handled, and relatively inexpensive microwave plasma source mounted on the lid of a deposition system. The remote microwave plasma source has a plasma reaction volume that is relatively large compared to a plasma applicator tube volume. Locating the gas inlet between the plasma reaction volume and a microwave power coupler improves the conversion efficiency of microwave energy to ionic plasma species.

18 Claims, 7 Drawing Sheets

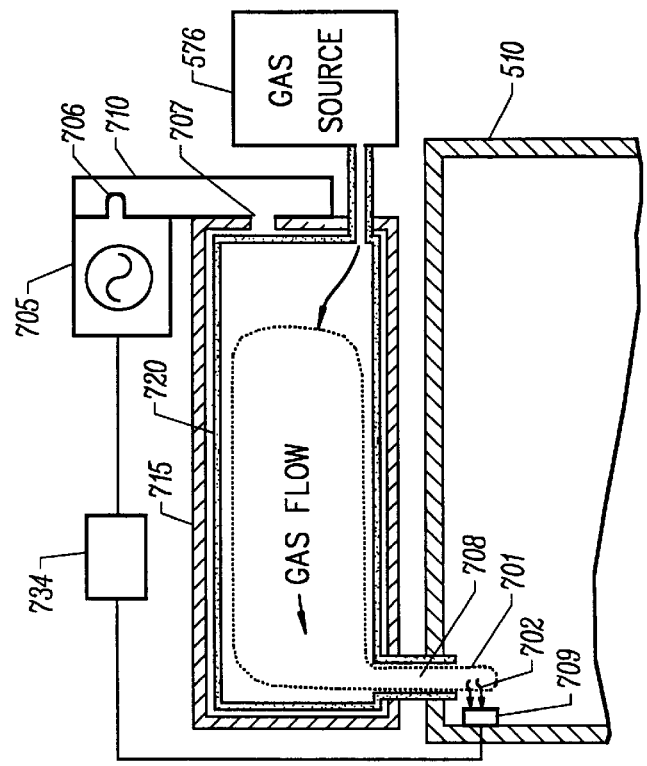
FIG. 6
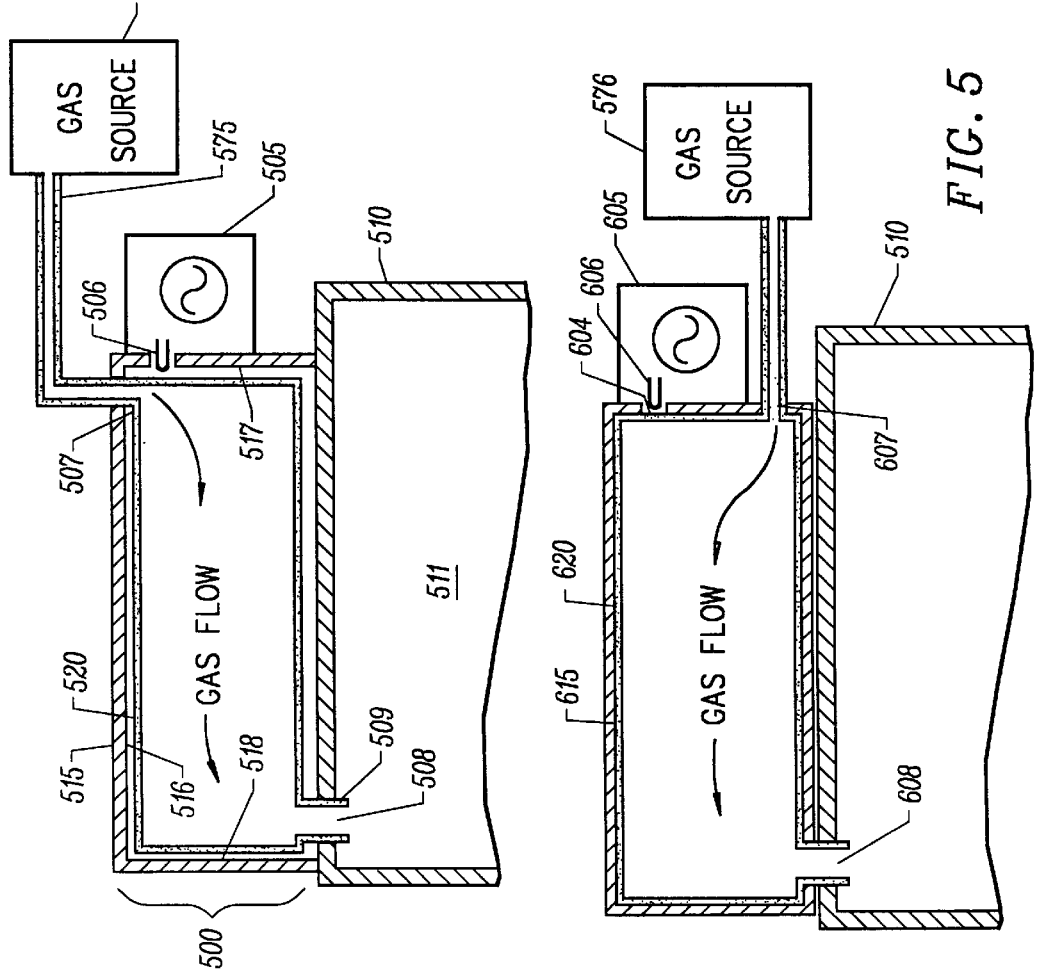
FIG. 4
FIG. 5

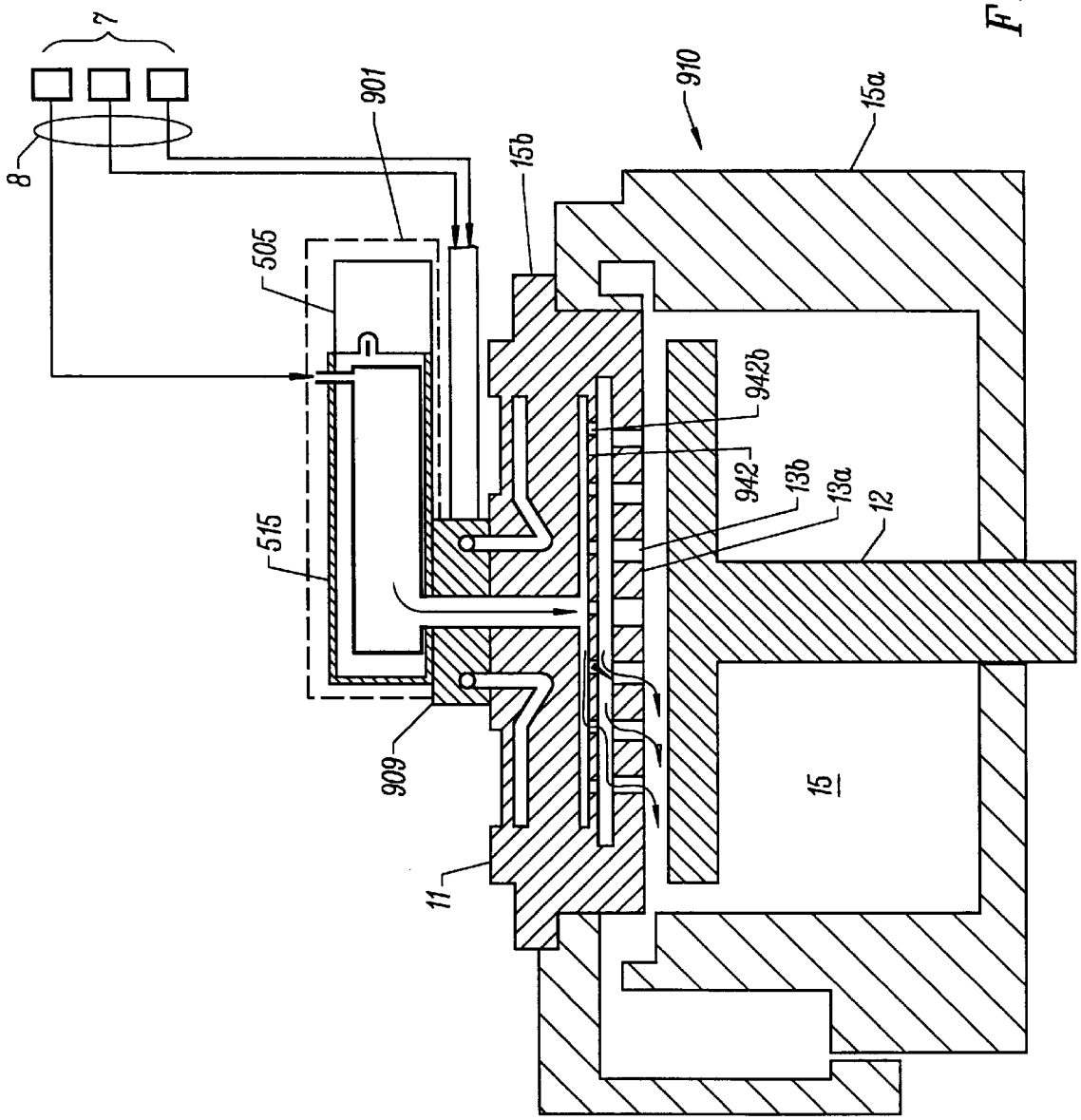

APPARATUS AND METHOD FOR EFFICIENT AND COMPACT REMOTE MICROWAVE PLASMA GENERATION

BACKGROUND OF THE INVENTION

This invention relates to the formation of a plasma using microwave energy, and in particular to an efficient, compact, high-output plasma source for use with deposition systems. Such deposition systems may be used in fabricating semiconductor wafers, for example.

A plasma is a partially ionized gas containing positive and negative ions and radicals. These ions and radicals may be beneficial in many types of operations used in processing semiconductor wafers. Examples of such operations include plasma-enhanced chemical vapor deposition (PECVD), sputtering deposition, sputter etching, reactive-ion etching (ion-assisted sputter etching), and plasma etching (ionic-chemical) or cleaning processes.

One way a plasma can be created is to apply an electric field across a gas. Under the proper conditions, free electrons (generated by a passing cosmic ray, spark discharge, or ultraviolet light source, for example) are accelerated to sufficient energy so that an inelastic collision between the electron and a gas molecule results in the ionization of the molecule. A direct current (DC) field may be used to create a plasma, but high-frequency fields, such as radio frequency (RF) or microwave frequency (MW) are preferred to generate the desired plasma species as high-frequency fields produce a greater number of inelastic collisions. Some plasmas may form a glow discharge.

A glow discharge is a condition where there are a sufficient number of free electrons available to sustain a glowing plasma region. A self-sustaining number of free electrons may form when the energy transferred in an inelastic collision between an electron and a gas molecule (including single-atom gases) or ion is greater than the ionization potential for that gas molecule or ion. The collision may create a second free electron, and both the original and secondary electron may then be accelerated to an energy sufficient to create two new ionizing collisions, thus cascading the number of free electrons available to maintain a stable plasma. In this state, inelastic collisions between electrons and gas molecules that are insufficient to liberate a free electron may briefly excite an electron to a higher orbital state. As these excited electrons collapse to their ground state, they may release photons, often in the visible spectrum. This causes the plasma to glow, and gives the glow discharge its name.

Many processes create a plasma, often in the form of a glow discharge, at the location of the desired operation, or process zone. PECVD, for example, typically uses such an in situ plasma because the physical movement, as well as the chemical activity, of the plasma species is important to the process. Some other processes, such as some plasma etching or cleaning processes, do not require the plasma to be generated at the process zone. The desired plasma species created in the glow discharge may have a sufficient lifetime before recombining into neutral species such that the plasma species may be used in a location remote from the plasma activation (glow discharge) zone.

FIG. 1 shows a deposition system that utilizes one type of a prior art remote plasma source. In this system, a microwave source 100 is connected to a waveguide 110 that irradiates process gas in the discharge tube 120 to form a glow discharge 111. The discharge tube conveys ions and radicals resulting from the glow discharge 111 to the processing chamber 130 through the applicator tube 121. This may be an inefficient way to create a plasma for at least three reasons. First, a waveguide typically transmits only certain modes of microwave fields, reducing the power from the microwave source, which may generate power in many different modes, to the plasma interaction (glow discharge) zone. Second, many ions may recombine into molecules as they travel down the applicator tube to the process zone, reducing the number and/or concentration of ions available for the process. Finally, the potential volume available for interaction between the plasma and the microwaves may be limited by the cross-section of the waveguide and the crosssection of the discharge tube. This may limit the generation of ions and radicals at a given pressure and flow within the discharge tube because the volume of the plasma activation zone (interaction volume) is small compared to the total volume of the applicator tube; for example, some designs use a two-inch lengthwise section of a tube having a one-inch diameter for the plasma activation zone. Because the interaction volume is so small, high-power-density, relatively expensive, DC microwave power supplies are typically used in order to obtain sufficiently high microwave coupling.

However, it is more expensive to operate such high-power-density supplies than 100-W to 700-W magnetrons, for example. In addition, remote plasma systems that transmit high-power microwave energy through a waveguide to a small interaction zone concentrate the heat generated by the plasma in a fairly small volume. Therefore, conventional remote plasma systems often use a cooling system to keep the applicator tube from overheating. Typically, these are liquid-cooled systems, which add initial expense and maintenance costs. Also, liquid-cooled systems often suffer from leakage problems. Such leakage may lead to corrosion of the equipment, which may cause a degradation in the quality of the processed substrates.

Another type of problem related to the type of remote plasma system shown in FIG. 1 is that it is complicated and bulky. This may affect the time and effort required to disconnect the remote plasma system for chamber maintenance, especially if a cooling system is involved. Additionally, if this microwave system is improperly reconnected afterwards, microwave energy may radiate into the surrounding room, posing a safety threat to personnel and interfering with electronic devices.

FIG. 2 shows another type of remote plasma source used with wafer processing chambers, sharing some of the disadvantages of the system shown in FIG. 1. In the system shown in FIG. 2, a microwave antenna, or launcher 201, couples energy from a microwave source 200 into a resonator cavity 240. The microwave source 200 may be a 2.45-GHz magnetron, for example. While a greater volume of gas, compared to the system of FIG. 1, may be irradiated with microwave energy in the configuration shown in FIG. 2, the volume of the discharge tube 220 within the resonator cavity 240 is substantially less than the total volume of the discharge tube 220 and the applicator tube 221. As described above, recombination of some of the plasma ions and radicals desired for processing may occur in the applicator tube 221, reducing the concentration of ions radicals in the plasma that reach the processing chamber 230.

Another problem with some plasma systems, such as those shown in FIGS. 1 and 2, arises from the variable absorption of microwave energy by the plasma as the plasma density changes. When microwave energy is first transmitted to the gas in the applicator tube it may accelerate electrons to sufficient energy so that the electrons collide with gas molecules, as discussed above. These collisions may create additional free electrons and other ionic species. At the onset of irradiation, the gas may be nearly electrically nonconductive. As the ion and free electron concentration increases, the plasma becomes more and more conductive, increasing in conductivity by up to two orders of magnitude, or more. The plasma may become so conductive that it reflects a significant portion of the microwave energy that impinges on it. At some point, the plasma will reach a critical density, where it will not absorb any additional energy. This is called the critical density ($N_C$), and is about $7 \times 10^{10}$ ions/cmn$^{-3}$ at 2.45 GHz. At this point, the plasma may become unstable and flicker, and the high amount of energy reflected from the plasma back to the microwave source may damage the source. The typical response is to operate the plasma system well below $N_C$. However, this means that the ion density in the plasma is well below the maximum possible concentration. To prevent damage to the microwave source, matching networks, such as mechanically tunable stubs, have been used to improve the power transfer efficiency between the source and the load (plasma) in some systems. However, because the impedance (conductivity) of the plasma may vary over such a wide range, it may be difficult to obtain a good match over the entire range of plasma densities and operating conditions.

From the above, it can be seen that it is desirable to have a compact remote microwave plasma system that efficiently produces a high concentration of ions for cleaning of chemical vapor deposition (CVD) apparatus and other apparatus. Such a system should provide a reasonably constant ion density from a stable plasma and should not expose the processing chamber to the potentially harmful effects of a glow discharge. It is further desirable that the remote plasma system be simple, preferably small enough to fit on the lid of a processing chamber.

SUMMARY OF THE INVENTION

The present invention provides apparatus for microwave plasma-generating systems, and processes for forming a microwave-generated plasma. A microwave plasma-generating system may be incorporated with a CVD system to provide a plasma that is used to efficiently clean a processing chamber of the CVD system, for example. Plasma from the microwave plasma-generating system may also be used for etching, layer deposition, or other processes.

In one embodiment, a microwave plasma source module includes a resonator cavity with a side wall, a near-end wall, and a far-end wall. The walls are electrically conductive and coupled to each other, and define an interior volume of the resonator cavity. The resonator cavity contains a plasma discharge tube that has an inlet port and an outlet port. The inlet port is closer to the near-end wall and the outlet port is closer to the far-end wall. Power from a microwave power source may be coupled into the resonator cavity using various means, such as a launcher, an antenna, an aperture, or a window in a waveguide. The power is coupled into the resonator cavity substantially adjacent to the near-end wall of the resonator cavity. The gas flow is such that fresh process gas entering from the inlet port dilutes the plasma density in the proximity of the microwave coupler, thus reducing the microwave energy reflected from the plasma and enhancing the conversion of microwave energy to plasma. In some embodiments, the plasma discharge tube occupies substantially the entire volume of the resonator cavity, thereby providing a large interaction volume between the microwave energy within the resonator cavity and the process gas within the discharge tube.

When the microwave plasma source module is used with a processing chamber, the compact size of the microwave plasma source module allows it to be mounted on or very near to the processing chamber. An applicator tube delivers the plasma from the discharge tube to the processing chamber. The close proximity of the module to the chamber allows the volume of the applicator tube to be substantially less than the volume of the discharge tube, thereby reducing the recombination of reactive plasma species before those reactive species may be used in the processing chamber. When the microwave plasma source module is used with a processing chamber, a photodetector may be used to detect when a glow discharge is bowing out of the discharge and applicator tubes into the processing chamber. The photodetector may be used to control the amount of microwave energy within the resonator cavity, and thereby limit the incursion of a glow discharge into the processing chamber.

A further understanding of the objects and advantages of the present invention may be realized by reference to the remaining portions of the specification and the attached drawings.

BRIEF DESCRIPTION OF THE DRAWINGS

FIG. 4 is a cross-sectional view of one embodiment of a remote plasma system and processing chamber;

FIG. 5 is a cross-sectional view of another embodiment of a remote plasma system and processing chamber utilizing a metal-coated discharge tube;

FIG. 6 is a cross-sectional view of another embodiment of a remote plasma system and processing chamber incorporating a photodiode to control the incursion of a glow discharge into the processing chamber.

FIG. 8. is a simplified cross-sectional view of a remote plasma generator mounted on a lid of a substrate-processing chamber.

DESCRIPTION OF SPECIFIC EMBODIMENTS

The remote generation of a plasma for use in a process may be desirable for many reasons. One reason is that a higher concentration of the desired plasma species may be obtainable than if the plasma was generated in situ. Another reason is that the process zone is not bombarded with high-energy particles, or directly exposed to the light or heat generated by the glow discharge.

I. Exemplary CVD System

Figure 3A:
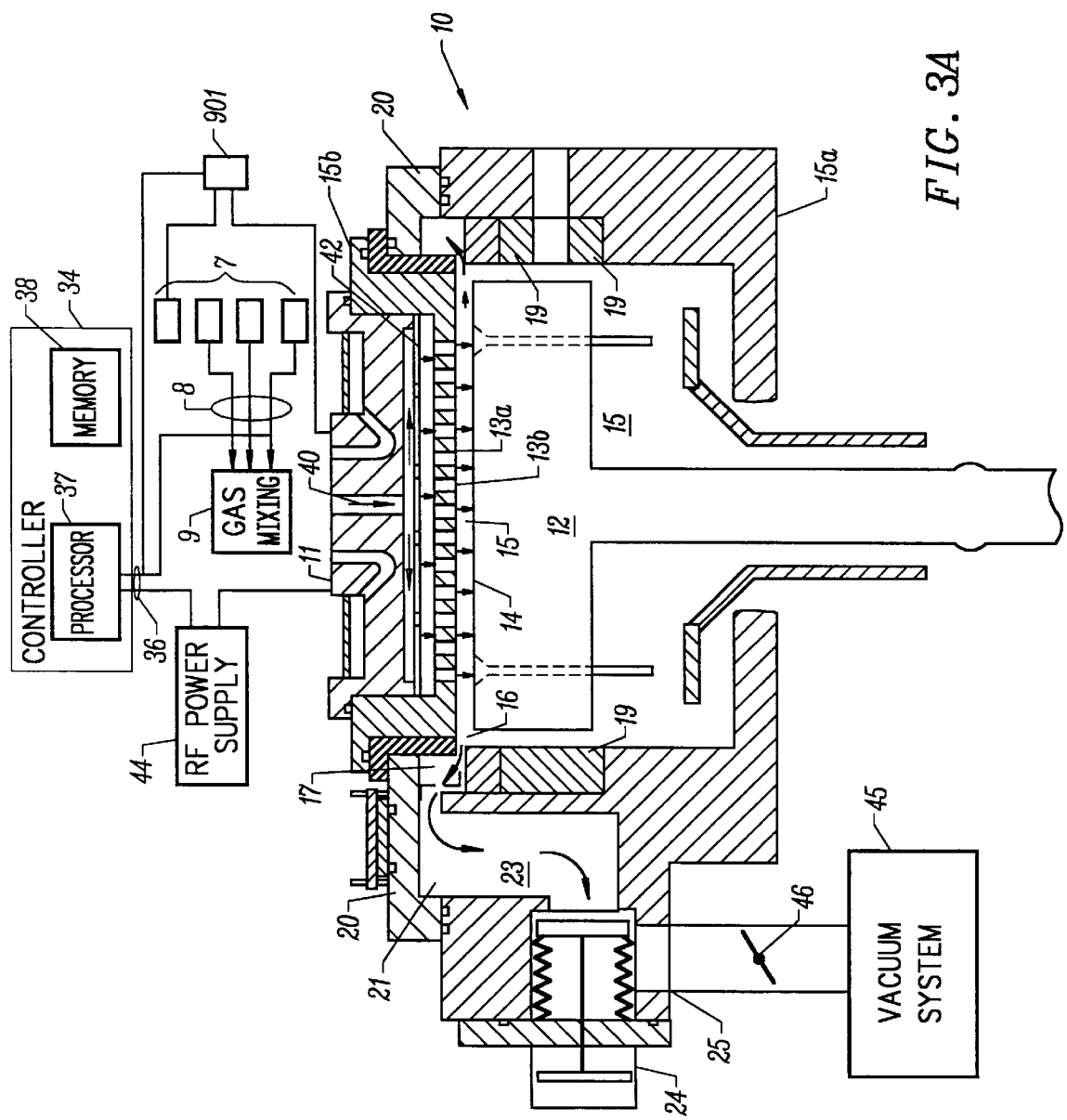
FIG. 3A is a cross-sectional view of one embodiment of a chemical vapor deposition apparatus according to the present invention.
Figure 3B:
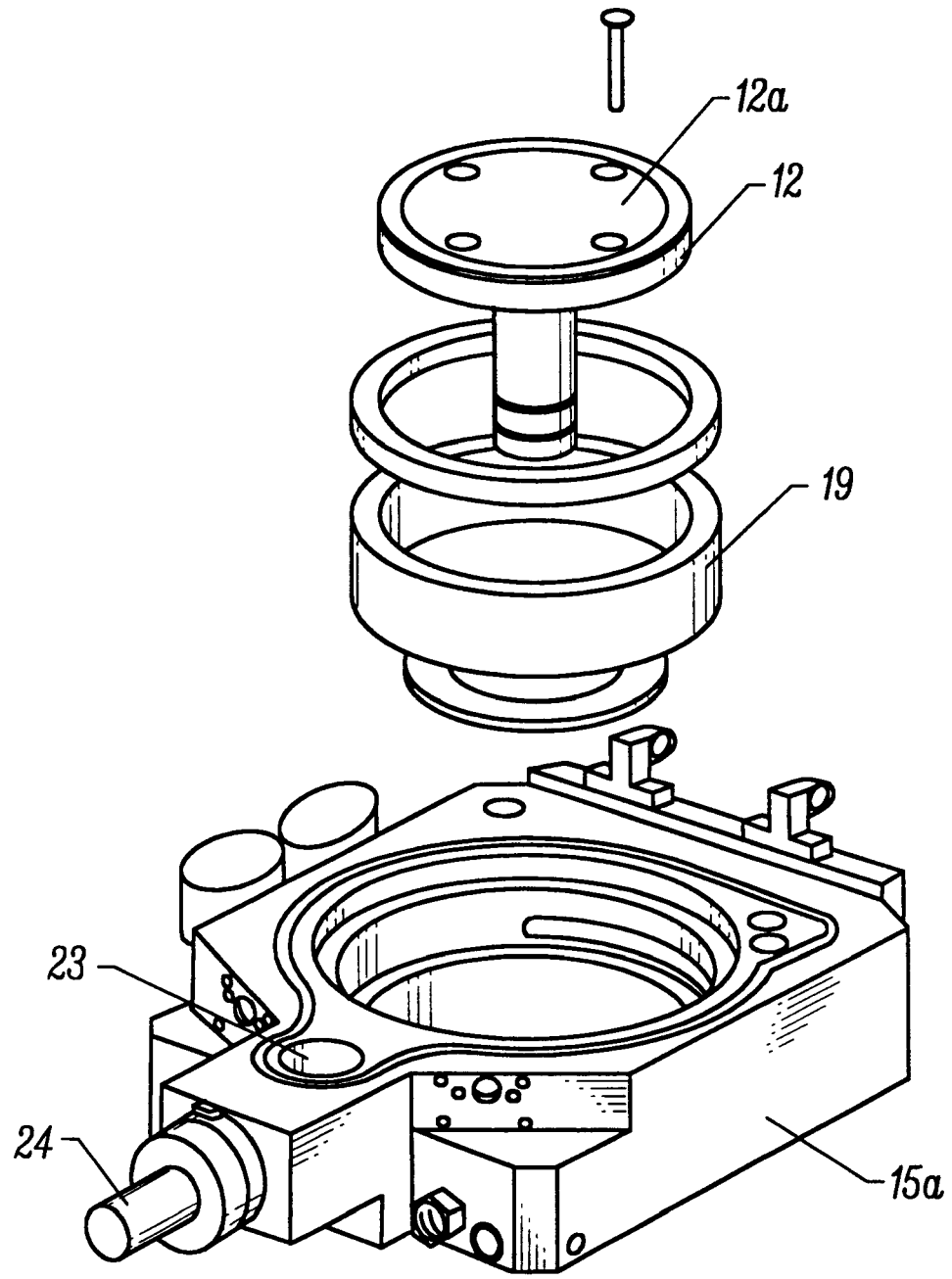
FIGS. 3B and 3C are exploded perspective views of parts of the CVD chamber depicted in FIG. 3A.
Figure 3C:
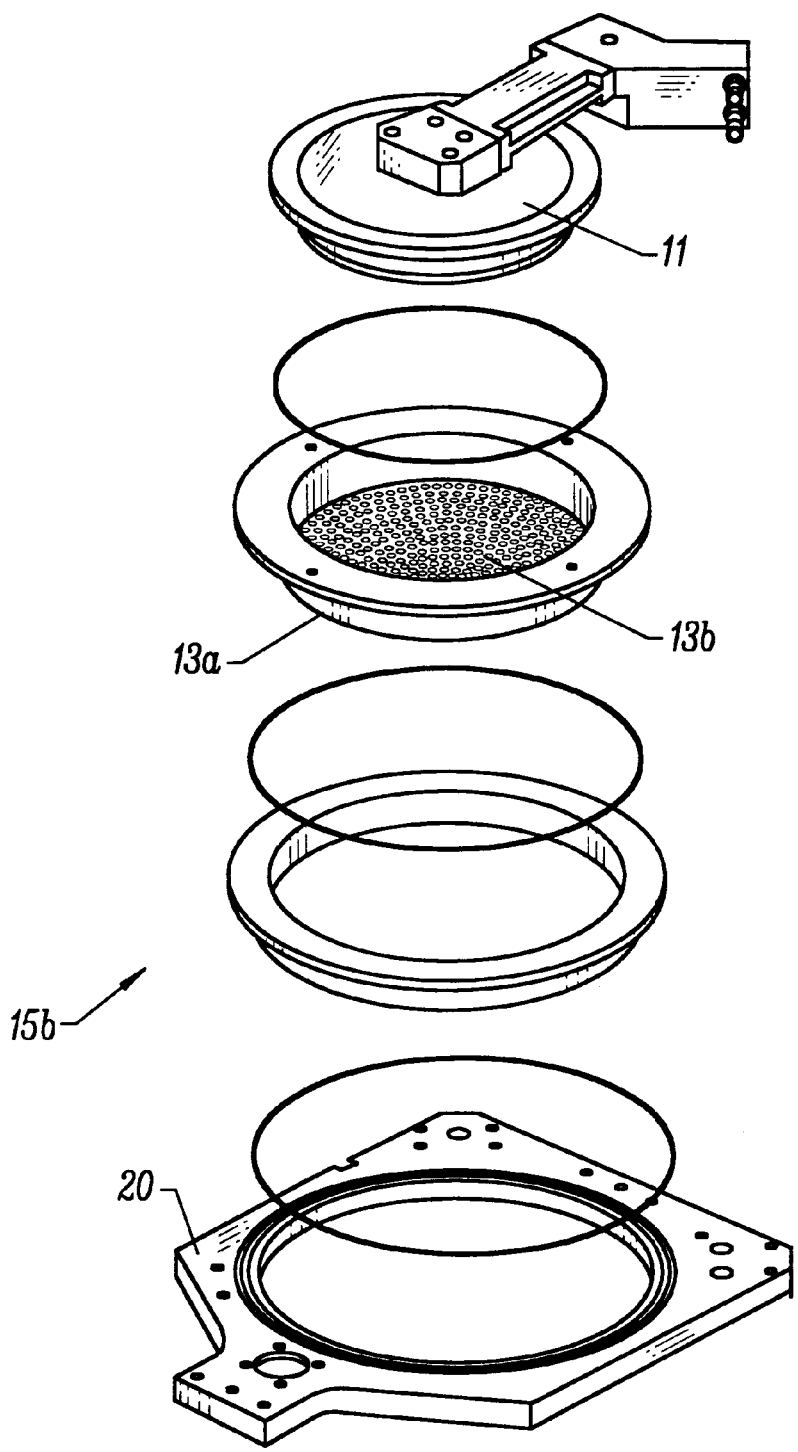

Specific embodiments of the present invention may be used with or retrofitted onto a variety of substrate-processing systems. One suitable CVD system with which the present invention can be used or retrofitted is shown in FIG. 3A which is a vertical, cross-sectional view of a CVD system 10, having a vacuum or processing chamber 15 that includes a chamber wall 15a and chamber lid assembly 15b. Chamber wall 15a and chamber lid assembly 15b are shown in exploded, perspective views in FIGS. 3B and 3C.

The chamber lid assembly 15b includes a gas distribution manifold 11 for dispersing process gases to a substrate (not shown) that rests on a heater-pedestal 12 centered within the process chamber. During processing, the substrate (e.g., a semiconductor wafer) is positioned on a flat (or slightly convex) upper surface 14 of heater-pedestal 12. Heater-pedestal 12 can be moved controllably between a lower loading/off-loading position and an upper processing position (not shown). A centerboard (not shown) includes sensors for providing information on the position of the wafers, which may be monitored by a system controller 34.

The system controller 34 may be configured to monitor and control various aspects of the deposition system 10, such as the wafer position, the gas flows, RF or microwave power, and chamber pressure through sensor lines (not shown) and control lines 36 (only some of which are shown). The system controller 34 receives control signal information from various sensors, such as optical sensors, thermocouples, mass flow controllers, and manometers. The processor 37 may determine whether any adjustments are necessary according to a processing program that may be stored in the memory 38. For example, during a remote plasma clean, the system controller may turn on a process gas flow from a gas source 7 to the remote plasma system 901, set and maintain a chamber pressure by reading a manometer (not shown) and adjusting the throttle valve position with a stepper motor (not shown), and then energize the remote plasma system's microwave source (not shown). Other processes may be similarly controlled by the system controller according to other programs stored in the memory 38.

Deposition and carrier gases are introduced into chamber 15 through perforated holes 13b (FIG. 3C) of a flat, circular gas-distribution faceplate 13a. More specifically, deposition process gases flow (indicated by arrow 40 in FIG. 3A) into the chamber through the inlet manifold 11, through a conventional perforated blocker plate 42, and then through holes 13b in gas distribution faceplate 13a.

Before reaching the manifold, deposition and carrier gases are input from gas sources 7 through gas supply lines 8 (FIG. 3A) into a gas-mixing block 9, where they may be combined prior to flowing to manifold 11. Generally, the supply line for each process gas includes (i) several safety shut-off valves (not shown) that can be used to automatically or manually shut off the flow of process gas into the chamber, and (ii) mass flow controllers (also not shown) that measure and control the flow of gas through the supply line. When toxic gases are used in the process, the several safety shut-off valves are positioned on each gas supply line in conventional configurations.

Deposition processes performed in reactor 10 can be either plasma-enhanced or non-plasma-enhanced process. In a plasma-enhanced process, an RF power supply 44 may generate an electric field between the gas distribution faceplate 13a and heater-pedestal 12, which forms a plasma from the process gas mixture within the cylindrical region between the faceplate 13a and heater-pedestal 12. Constituents of the plasma may react to deposit a film on chamber surfaces, such as the exposed portion of heater-pedestal 12, as well as on the surface of the semiconductor wafer. Of course, other substrate-processing systems may not have an RF power supply or the capability to form an in situ plasma. Incorporation of a remote plasma generator may be especially desirable in a substrate processing system without in situ plasma capability, but a remote plasma generator may also be incorporated into other types of systems, such as the present system.

RF power supply 44 can be a mixed-frequency RF power supply, which means that it may supply power at a higher RF frequency (RF1) of 13.56 MHz, and at a lower RF frequency (RF2), for example, 360 KHz, to enhance the deposition process. Of course, RF power supply 44 can supply either single- or mixed-frequency RF power (or other desired variations) to manifold 11 to enhance the decomposition of reactive species introduced into chamber 15.

In a thermal process, RF power supply 44 is not utilized, and the process gas mixture thermally reacts to deposit the desired film on the surface of the semiconductor wafer supported on heater-pedestal 12, which may be heated with a heater (not shown), such as an electrical resistance heater, to provide the thermal energy needed for the reaction to proceed.

During a plasma-enhanced deposition process, the plasma heats adjacent portions of reactor 10, including the walls of the chamber body 15a surrounding the exhaust passageway 23 and the vacuum shut-off valve 24. During a thermal deposition process, heater-pedestal 12 radiates heat to portions of reactor 10. When the plasma is not turned on, or during a thermal deposition process, a temperature-controlled liquid is circulated through the walls 15a of reactor 10 to maintain the chamber at a selected temperature, typically above ambient temperature. Fluids used to heat the chamber walls 15a include the typical fluid types, i.e., water-based ethylene glycol or oil-based thermal transfer fluids. This heating reduces or eliminates condensation of undesirable reactant products and improves the elimination of volatile products of the process gases and contaminants that may otherwise condense on the walls of the cooler vacuum passages and migrate back into the processing chamber during periods of no gas flow.

The portion of the gas mixture that is not deposited in a layer, including the reactant products, is evacuated from the chamber by a vacuum system 45. Specifically, the gases are exhausted through an annular, slot-shaped orifice 16 surrounding the reaction region and into an annular exhaust plenum 17. The annular slot-shaped orifice 16 and the exhaust plenum 17 are defined by the top of the chamber's cylindrical side wall 15a (including the upper dielectric lining 19 on the wall) and the bottom of the circular chamber lid 20. The circular symmetry and uniformity of the annular slot-shaped orifice 16 and the exhaust plenum 17 achieve a uniform flow of process gases over the wafer so as to deposit a uniform film on the wafer.

The gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25. A throttle valve 46 may be used to control the exhaust capacity and therefore the chamber pressure at a particular inlet gas flow. The throttle valve 46 may be set in a fixed position, or set according to a program stored in the memory 38 based on the chamber pressure, as measured with a manometer (not shown), and controlled with controller 34.

The wafer-support platter of resistively heater-pedestal 12 may be heated using an embedded heater element (not shown) configured to make two full turns in the form of parallel concentric circles, or other appropriate heater element. In a specific embodiment, an outer portion of the heater element runs adjacent to a perimeter of the support platter, while an inner portion runs on the path of a concentric circle having a smaller radius. The wiring to the heater element passes through the shaft of heater-pedestal 12. Heater-pedestal 12 may be made of material including aluminum, stainless steel, alumina, aluminum nitride, or other similar materials or combinations of materials.

Typically, any or all of the chamber lining, gas inlet manifold faceplate, and various other reactor hardware are made out of material such as aluminum, anodized aluminum, or ceramic. An example of such CVD apparatus is described in commonly assigned U.S. Pat. No. 5,558,717 entitled "CVD Processing Chamber," issued to Zhao et al.

The above reactor description is mainly for illustrative purposes, and other equipment such as electron-cyclotron-resonance (ECR)-plasma CVD devices, induction-coupled, RF, high-density-plasma CVD devices, or the like may be used with the present invention to provide upgraded apparatus. Additionally, variations of the above-described system, such as variations in pedestal design, heater design, RF power frequencies, location of RF power connections and others are possible. For example, the wafer could be supported by a susceptor and heated by quartz lamps. The present invention is not limited to use with or retrofitting of any specific apparatus.

II. Specific Embodiments Using A Microwave Magnetron Assembly

Figure 7:
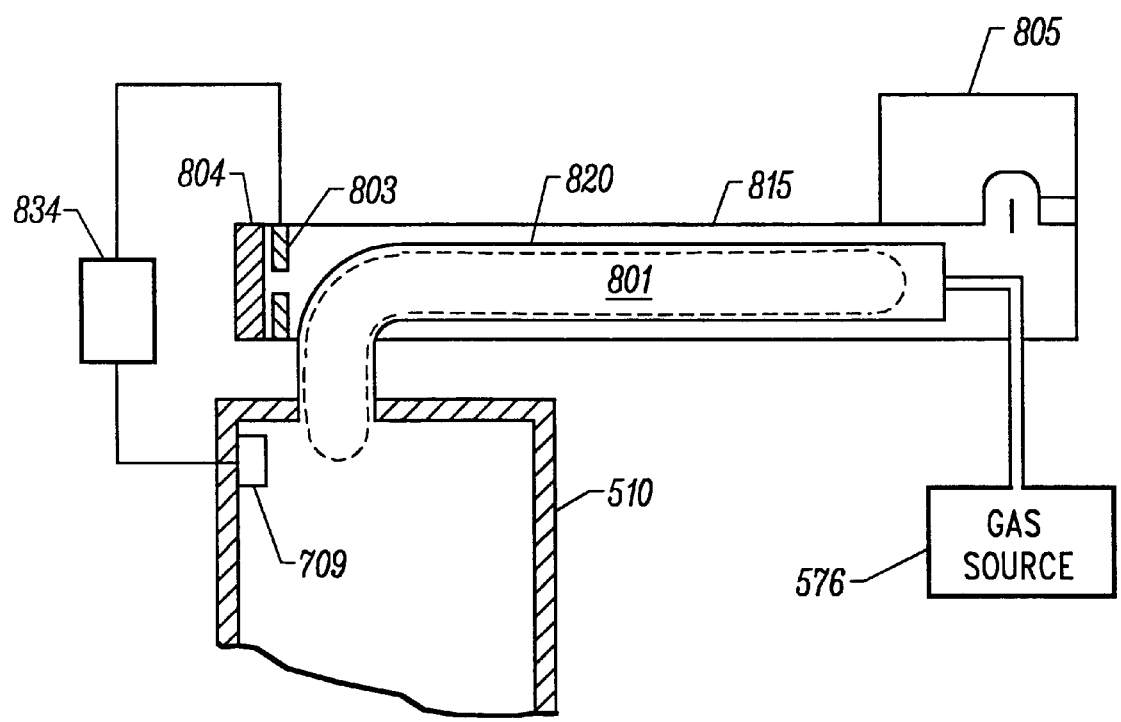
FIG. 7 is a simplified cross-sectional view of another embodiment of a remote plasma system and processing chamber incorporating a glow discharge detector and an adjustable aperture.

According to specific embodiments of the present invention, a CVD apparatus may be provided by attaching a remote microwave plasma source to existing CVD apparatus or by retrofitting the existing CVD apparatus to incorporate a microwave plasma source. Although the discussion below focuses primarily on these specific embodiments, other embodiments within the scope of the invention will be apparent. Also, it should be noted that structures illustrated in FIGS. 5–7 are not necessarily drawn to scale.

FIG. 4 shows a simplified cross-sectional side-view of a remote microwave plasma source module 500 according to a specific embodiment of the present invention, mounted on a processing chamber 510. In the specific embodiment, the entire assembly of the remote microwave plasma source module 500 includes a magnetron 505 mounted directly to a resonator cavity 515 without an intervening waveguide. A plasma discharge tube 520 is disposed through and within the resonator cavity 515. The interior surface of the resonator cavity 515 is electrically conductive, and the resonator cavity is preferably made of a conductive material, such as aluminum, copper, or stainless steel. The resonator cavity has a side wall 516, a near-end wall 517, and a far-end wall 518. According to a specific embodiment, the resonator cavity 515 has a length ($l^R$) of about 7 inches, a width ($w_R$) of about 6 inches, and a height ($h_R$) of about 5.1 inches, and the dominant mode is the $TE_{102}$ mode, as that mode is commonly known to those skilled in the art, of the microwaves having a frequency of about 2.45 GHz. The diameter of the discharge tube 520 is preferably at least about a quarter-wavelength of the operating microwave frequency, so that the length of the discharge tube 520 coincides with at least one electronic field (E-field) maximum. The length of the discharge tube 520 lies along a longitudinal axis, roughly parallel to the gas flow (indicated by arrows). It is to be understood that the "gas flow" is the net gas flow through the discharge tube, even though turbulence within the discharge tube may create locally transverse gas flows. The discharge tube 520 protects the resonator cavity 515 from the plasma formed within the discharge tube, while transmitting the microwave energy into the plasma. Because a plasma may transfer substantial heat to adjacent surfaces, the discharge tube 520 is fabricated from material that can withstand high temperatures, such as fused silica or alumina, which are dielectrics that transmit the microwave energy into the plasma within the discharge tube 520.

The remote microwave plasma source module 500 uses a magnetron 505 as the source for energy to the resonator cavity 515 for forming a plasma in the discharge tube 520 within the resonator cavity 515. Although a number of different microwave power supplies are available, pulsed, rather than continuous wave (CW), power supplies for powering the magnetron are used. In preferred embodiments, the magnetron 505 is a low-cost magnetron (e.g., the type of magnetron employed in some microwave ovens) operating on a low power, pulsed 60-Hz half-rectified power source to provide microwaves having a frequency of about 2.45 GHz. Such pulsed, low-power supplies for the magnetrons can be at least two orders of magnitude lower in price compared to a CW, high-power microwave generator or an RF generator.

A microwave antenna, or launcher 506 couples microwave power between the magnetron 505 and the resonator cavity 515. The launcher 506 may be, for example, a stub antenna, a slot antenna, or other radiating element that is able to communicate the microwaves from the magnetron 505 to the resonator cavity 515. A gas inlet port 507 is positioned such that the flow of process gas through the discharge tube 520 is longitudinal, rather than transverse, to the launcher 506. This creates a gradient of ion density that has a lower ion concentration near the launcher 506, thus improving the interaction between the gas and the microwave fields.

A gas feed line 575 delivers process gas or gases from the gas source 576 to the discharge tube 520 through the inlet port 507. Halogenated gases or vapors, such as $CF_4$, $ClF_3$, $F_2$, and $NF_3$ may be used as a process gas. Fluorine is a particularly desirable component in a process gas for use in a remote plasma generator because free fluorine radicals, which form in the plasma, readily react with many oxide and nitride deposits. Nitrogen trifluoride ($NF_3$) is desirable in a specific embodiment because it readily produces fluorine radicals in a microwave-generated plasma, resulting in an efficient cleaning process. Perfluorocarbons (PFC's) such as $CF_4$ are less desirable because they may be released into the atmosphere and damage the ozone layer. Chlorine-containing gases, such as $ClF_3$, may leave chlorine-containing residues that may interfere with some wafer processing operations subsequent to the cleaning process, and $F_2$ may be difficult to dissociate into and maintain as free fluorine radicals in a microwave plasma, which may result in a lower yield of radicals and a slower cleaning process.

The gas feed line 575 delivers process gas to the gas inlet port 507, which is positioned between the launcher 506 and the plasma outlet port 508, as shown in FIG. 4, or the inlet port may be essentially coplanar with the launcher. Either configuration produces a gas flow longitudinal to the launcher. Microwave energy from the launcher 506 energizes the gas to form a plasma. Initially, the total volume of the discharge tube is filled with essentially nonconductive gas, providing the magnetron 505 with a relatively high load impedance. The microwave currents travel along the surface of the resonator cavity 515 and create electromagnetic fields within the resonator cavity 515, some of which reach sufficient strength within the discharge tube 520 to ionize the process gas into a plasma without requiring the use of initial ionizing sources, such as UV lamps or spark generators. Sufficiently strong fields typically occur where incident and reflected energy combine to form high field nodes.

Figure 1:
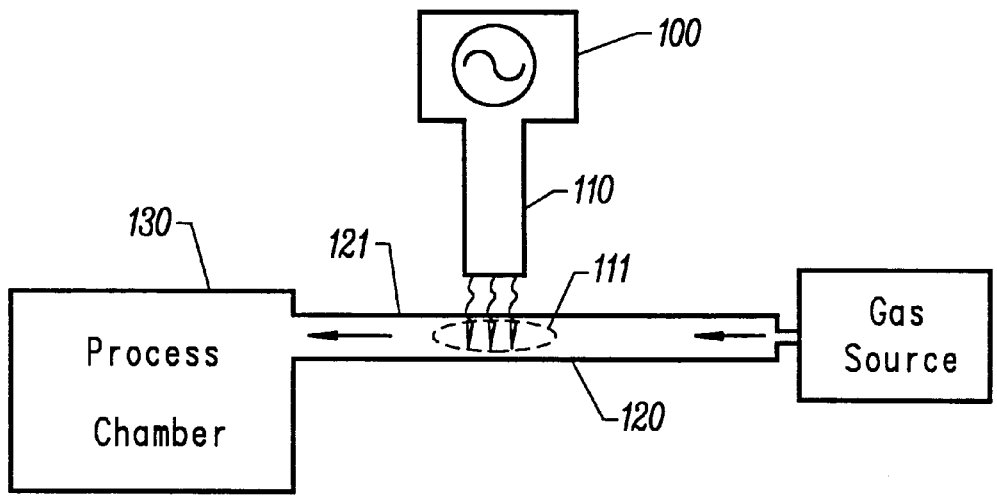
FIG. 1 is a diagram of a conventional remote plasma system using a waveguide to irradiate an applicator tube.
Figure 2:
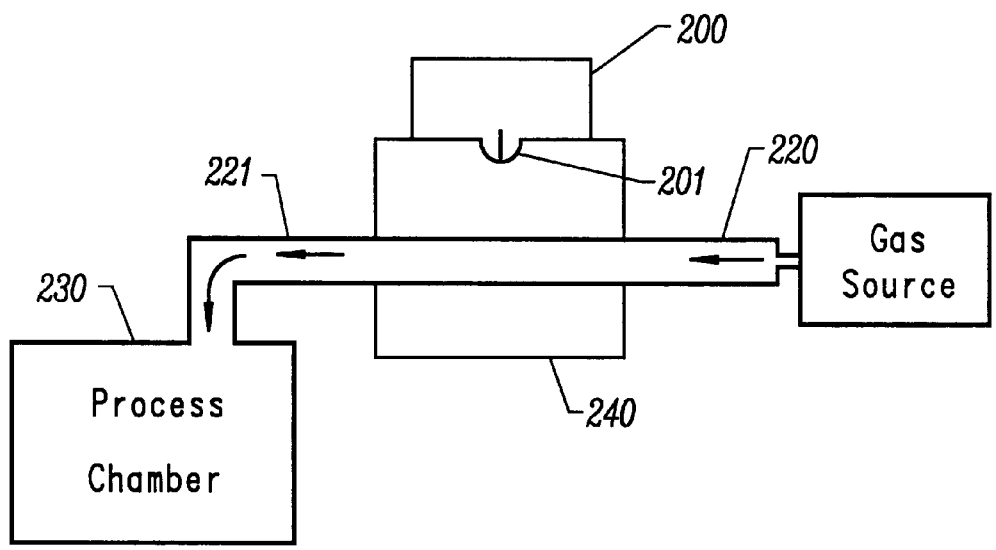
FIG. 2 is a diagram of a conventional remote plasma system using an applicator tube mounted transversely in a cavity.

As the plasma forms, it becomes more conductive. This has several effects. First, it lowers the load impedance, which may initially improve the efficiency of power transferred from the source. However, as the plasma ion density increases (becoming ever more conductive), the plasma typically reflects a significant portion of the incident microwave energy back to the source. As the plasma reaches the critical ion density ($N_C$), the power absorbed by the plasma will not increase with increased power applied. Accordingly, almost all the microwave power (e.g., except for resistive losses along the cavity walls, etc.) applied to a plasma at $N_C$ is reflected. Second, as the plasma becomes more conductive, it is better able to carry currents arising from the electromagnetic fields. Therefore, these fields may not penetrate into the plasma far enough to establish high field nodes within the intended interaction volume. In conventional systems, such as shown in FIGS. 1 and 2, the result is that much of the power incident on the plasma is reflected, rather than being converted to plasma ions, which reduces conversion efficiency of microwave energy to plasma radicals, and may damage the microwave source.

In the present invention, a flow of process gas is admitted into the discharge tube between the launcher 506 and the plasma outlet port 508. This creates a mass flow of gas molecules and plasma ions away from the launcher 506, and into the process chamber 510 through the plasma outlet port 508 and the applicator tube 509. This flow fills the portion of the discharge tube 520 nearest the launcher 506 with a substantially nonionized gas. This ensures that the plasma nearest the microwave source is below $N_C$, because any plasma in this region that was at $N_C$ is diluted with substantially nonionized gas, thus allowing greater absorption of microwave energy, and hence greater production of ions and radicals.

In the embodiment of FIG. 4, the discharge tube 520 is disposed through and contained within the resonator cavity 515, such that the discharge tube 520 is substantially coextensive with the resonator cavity 515. It is believed that this provides at least three beneficial effects. First, there may be several high-field nodes within the resonator cavity capable of forming a plasma from the process gas. Providing a large interaction volume within the resonator cavity ensures that the process gas is exposed to more of these high field nodes. Exposing more of the process gas within the discharge tube allows for more efficient conversion of process gas into plasma. Second, ions formed from the process gas at the high-field nodes tend to repel each other. Providing a greater volume within the discharge tube allows for better diffusion of the ions away from high-field nodes. This diffusion lowers the localized concentration of ions near the nodes, resulting in a less reflective plasma in that region and better absorption of microwave energy by the plasma. Third, because the volume of the discharge tube 520 within the resonator cavity 515 is large compared to the total volume of the discharge tube (including the plasma output port 508), most of the process gas entering the discharge tube is irradiated. Therefore, there is little recombination of plasma ions into non-reactive species before those ions are delivered to the process zone 511 within the process chamber 510. Reducing the recombination of ions within the discharge tube improves the concentration, and hence the efficiency, of the plasma delivered to the reaction zone. In one embodiment, the interaction volume within the discharge tube is over 90% of the resonator cavity volume, and the volume of the applicator tube 509 is less than 10% of the total discharge tube volume. The interaction volume within the discharge tube could be increased even further, until it is substantially coextensive with volume of the resonator cavity.

The cavity and discharge tube may have various cross sections. In a specific embodiment, the discharge tube 520 is an alumina tube with a circular cross section. The resonator cavity 515 may also have a circular cross-section, thus minimizing the interior volume of the cavity that is not filled by the discharge tube, however, other configurations are possible. For example, the discharge tube may be circular (or other shape) and the cavity may be rectangular (or other shape).

FIG. 5 shows another embodiment of the invention where a fused silica discharge tube 615 has a conductive coating 620, such as a silver layer, on its outer surface. This configuration provides a discharge tube with a volume that is substantially coextensive with the resonator cavity. Alternatively, a plasma-resistant coating could be applied to a metal cavity to achieve a similar result. A magnetron 605 is joined to an end of the discharge tube 615, where there is a window 604 in the conductive layer that admits microwave energy from a launcher 606. The launcher 606 may be incorporated into the magnetron 605, or may be patterned within a conductive layer on the surface of the silica tube (not shown). In another embodiment, the window 604 may be replaced with an iris (not shown) that couples microwave energy into the cavity. A gas inlet port 607 enters the cavity between the window and a plasma outlet port 608. As in the embodiment shown in FIG. 4, the interaction volume within the discharge tube is over 90% of the resonator cavity volume, and the volume of the applicator tube is less than 10% of the total discharge tube volume.

The remotely generated plasma created by the magnetron source of the present invention consists of ions and radicals that have a purely chemical effect in the reaction zone of the processing chamber. As discussed above, physical sputtering and high energy particles are associated with glow discharges, which may be present with in situ plasmas. The physical effects of a glow discharge may be harmful to the processing chamber, a wafer in process, or may contaminate subsequent wafer processing operations. In some situations, a glow-discharge generated in a remote plasma system may extend beyond the discharge tube and into the processing chamber. This phenomenon is commonly called "bowing", and is undersireable in many instances. Therefore, it is desireable to detect a glow discharge bowing into a processing chamber from a remote plasma system and to take measures to eliminate the bowing.

FIG. 6 is a cross-sectional view of another embodiment of the present invention incorporating a glow discharge detector within the process chamber 510. For example, a photodiode 709 may be used to detect photons, represented by arrows, 702 emitted by the glow discharge 701 when it bows into the process chamber 510 through the plasma output port 708. The photodiode 709 is connected to a power controller 734 that reduces the power to the magnetron 705 when photons are detected, thereby reducing the microwave power delivered to the cavity 715. As the microwave power is decreased, the glow discharge shrinks, returning to the confines of the discharge tube 720. The power controller 734 may reduce the power to the magnetron 705 by reducing the duty cycle of the magnetron 705. FIG. 6 shows additional aspects of an alternative embodiment for coupling energy from the magnetron 705 to the cavity 715. A microwave transmission guide 710 couples microwave energy. from the launcher 706 to a window 707. The microwave transmission guide 710 may be a waveguide or a multimode transmission guide.

FIG. 7 shows an alternative embodiment of a glow-discharge control system where the photodiode 709 controls a conductive variable aperture 803. As is well known to those in the art, a variable aperture may be fabricated in many ways. For example, an iris aperture consisting of many metallic plates that concentrically open and close to define a central aperature, such as is used in some photographic cameras, is one way to form a conductive variable aperature. Another way to fabricate a variable aperture is as a curtain aperture, which may be made of metallic plates, such as two rectangles, that slide across each other to form a variable opening. The conductive variable aperture 803 is between a glow-discharge region 801 and an absorptive medium 804. The absorptive medium 804 may be water or an absorptive gas, for example, and removes microwave energy from the cavity 815 by converting the microwave energy to heat, which may then be dissipated by venting or heat-exchanging, among other means. If the photodiode 709 detects photons emitted from the glow-discharge region bowing into the process chamber 510, an aperture controller 834 opens the conductive variable aperture 803 so that more surface area of the absorptive medium 804 is exposed to the microwave energy inside the cavity 815. This causes more microwave energy to be converted to heat in the absorptive medium and reduces the microwave energy that might otherwise be reflected off the conductive variable aperture 803, allowing the magnetron 805 to operate at a fixed power level. These effects combine to reduce the microwave energy available for sustaining the glow discharge, which may then shrink back into the discharge tube 820, so that the glow discharge does not protrude into the process chamber 510.

FIG. 8 shows an embodiment for mounting a remote plasma system 901 on a chamber lid 15*b* of a substrate processing system 910. The plasma generated by the remote plasma system 901 flows through a gas mixing block 909 and then through the gas distribution faceplate 13*a* before flowing into the process chamber 15, as indicated by arrows. This flow pattern provides a high concentration of free fluorine radicals to remove unwanted oxide and nitride deposits from the faceplate 13*a* and the diffuser plate 942, and especially from the gas distribution holes 13*b* and the diffuser holes 942*b*.

While the above is a complete description of specific embodiments of the present invention, various modifications, variations, and alternatives may be employed. For example, the remote plasma source could be attached to the side of a process chamber, rather than the top. Other variations will be apparent to persons of skill in the art. These equivalents and alternatives are intended to be included within the scope of the present invention. Therefore, the scope of this invention should not be limited to the embodiments described, and should instead be defined by the following claims.

What is claimed is:

1. A microwave plasma source module for use with a substrate processing system, said microwave plasma source module comprising:
   a resonator cavity with a first interior volume, said resonator cavity including a side wall, a near-end wall and a far-end wall, wherein said side wall is electrically coupled to said near-end wall and said far-end wall;
   a plasma discharge tube with a second interior volume disposed within said resonator cavity, said plasma discharge tube having an inlet port closer to said near-end wall than said far-end wall and a plasma outlet port closer to said far-end wall than said near-end wall; and
   a microwave power source with a launcher at or substantially adjacent to said near-end wall of said resonator cavity.

2. The microwave plasma source module of claim 1 wherein said microwave power source is a pulsed magnetron operating at about 2.45 GHz.

3. The microwave plasma source module of claim 1 wherein said side wall is cylindrical.

4. The microwave plasma source module of claim 1 wherein said second interior volume of said discharge tube is greater than about 90 percent of said first interior volume of said resonator cavity.

5. The microwave plasma source module of claim 1 further comprising a gas source providing a process gas to said inlet port to establish a flow away from said launcher along a longitudinal axis.

6. The microwave plasma source module of claim 1 further comprising an applicator tube with a third interior volume less than about 10 percent of said second interior volume of said discharge tube.

7. A remote microwave plasma apparatus for use with a substrate processing system, said remote microwave plasma apparatus comprising:
   a process chamber;
   a resonator cavity, said resonator cavity being formed by at least a side wall, a near-end wall and a microwave-absorbing material, wherein said side wall is electrically coupled to said near-end wall;
   an adjustable aperture disposed between said microwave absorbing material and said resonator cavity, said adjustable aperture being electrically coupled to said side wall;
   a plasma discharge tube disposed within said resonator cavity, said plasma discharge tube having an inlet port and a plasma outlet port;
   a microwave power source with a launcher, said launcher coupling microwave energy from said microwave power source to said resonator cavity;
   a glow-discharge detector adjacent to said plasma outlet port; and
   an aperture controller coupled to said glow discharge detector, said aperature controller adjusting said adjustable aperture in response to a signal produced by said glow-discharge detector upon detection of a glow discharge.

8. The remote microwave plasma system of claim 7 wherein said adjustable aperture is an iris or a curtain shutter.

9. The remote microwave plasma system of claim 7 wherein said glow discharge detector is a photodetector.

10. A remote microwave plasma apparatus for use with a substrate processing system, said remote microwave plasma apparatus comprising:
    a process chamber;
    a resonator cavity;
    a plasma discharge tube disposed within said resonator cavity, said plasma discharge tube having an inlet port and a plasma outlet port;
    a microwave power source with a launcher coupling microwave energy from said microwave power source to said resonator cavity;
    a gas source providing a process gas flow to said plasma discharge tube at said inlet port;
    a glow-discharge detector adjacent to said plasma outlet port; and
    a power controller coupled to said microwave power source and to said glow-discharge detector.

11. A substrate processing apparatus comprising:

a processing chamber;

a microwave resonator cavity coupled to said processing chamber;

a plasma discharge tube disposed within said microwave resonator cavity coupled to said processing chamber through a plasma outlet port;

a microwave source coupled to said microwave resonator cavity with a launcher; and a gas delivery system configured to deliver a longitudinal flow of a gas to said plasma discharge tube at an inlet port of said plasma discharge tube said inlet port being proximate to said launcher.

12. A method for generating plasma species comprising the steps of:

a) providing a discharge tube within a resonator cavity, said discharge tube having inlet and outlet ports;

b) providing a launcher capable of coupling microwave energy from a microwave power source to said resonator cavity;

c) flowing a process gas into the inlet port in said discharge tube, said inlet port being proximate to said launcher; and d) forming a plasma from said process gas in said discharge tube by applying said microwave energy to said process gas.

13. The process of claim 12 wherein said process gas comprises fluorine.

14. The process of claim 12 wherein said process gas comprises $NF_3$.

15. The process of claim 12 wherein said microwave power source is a pulsed magnetron source.

16. The process of claim 12 wherein said discharge tube has a first volume and said resonator cavity has a second volume, said first volume of said discharge tube being at least about 90% of said second volume of said resonator cavity.

17. The process of claim 12 wherein said discharge tube has a first volume and further comprising an applicator tube with a third volume, said third volume of said applicator tube being less than about 10% of the sum of said first volume of said discharge tube and said third volume of said applicator tube.

18. The process of claim 12 wherein said process gas flows in a net longitudinal direction from said launcher to said outlet port.

* * * * *